(12) United States Patent
Brofman et al.

(10) Patent No.: US 9,373,559 B2
(45) Date of Patent: Jun. 21, 2016

(54) LOW-STRESS DUAL UNDERFILL PACKAGING

(71) Applicant: International Business Machines Corporation, Armonk, NY (US)

(72) Inventors: Peter J. Brofman, Hopewell Junction, NY (US); Marie-Claude Paquet, Bromont (CA); Julien Sylvestre, Chambly (CA)

(73) Assignee: International Business Machines Corporation, Armonk, NY (US)

(*) Notice: Subject to any disclaimer, the term of this patent is extended or adjusted under 35 U.S.C. 154(b) by 108 days.

(21) Appl. No.: 14/197,280

(22) Filed: Mar. 5, 2014

(65) Prior Publication Data
US 2015/0255312 A1    Sep. 10, 2015

(51) Int. Cl.
*H01L 21/56* (2006.01)
*H01L 23/31* (2006.01)
(Continued)

(52) U.S. Cl.
CPC .......... *H01L 23/3142* (2013.01); *H01L 21/563* (2013.01); *H01L 23/49838* (2013.01); *H01L 24/17* (2013.01); *H01L 24/27* (2013.01); *H01L 24/83* (2013.01); *H01L 25/0657* (2013.01); *H01L 24/13* (2013.01); *H01L 24/16* (2013.01); *H01L 24/29* (2013.01); *H01L 24/73* (2013.01); *H01L 24/81* (2013.01); *H01L 24/92* (2013.01); *H01L 2224/0401* (2013.01); *H01L 2224/131* (2013.01); *H01L 2224/14131* (2013.01); *H01L 2224/16145* (2013.01); *H01L 2224/16148* (2013.01); *H01L 2224/16225* (2013.01); *H01L 2224/16227* (2013.01); *H01L 2224/1703* (2013.01); *H01L 2224/17181* (2013.01); *H01L 2224/2732* (2013.01); *H01L 2224/2755* (2013.01); *H01L 2224/2919* (2013.01); *H01L 2224/29036* (2013.01); *H01L 2224/3201* (2013.01); *H01L 2224/32145* (2013.01);
(Continued)

(58) Field of Classification Search
CPC ....... H01L 21/563; H01L 24/29; H01L 24/73; H01L 24/97; H01L 23/3121; H01L 21/56; H01L 21/561; H01L 21/566
See application file for complete search history.

(56) References Cited

U.S. PATENT DOCUMENTS 6,331,446 B1 * 12/2001 Cook ................... H01L 21/563
257/E21.503
6,365,441 B1    4/2002 Raiser et al.
(Continued)

OTHER PUBLICATIONS
Zhang et al., "Recent Advances in Flip-Chip Underfill: Materials, Process, and Reliability", IEEE Transactions on Advanced Packaging, vol. 27, No. 3 Aug. 2004. pp. 515-524.
(Continued)

*Primary Examiner* — Matthew W Such
*Assistant Examiner* — Stephen C Smith
(74) *Attorney, Agent, or Firm* — Steven J. Meyers; L. Jeffrey Kelly; Howard M. Cohn

(57) ABSTRACT

The present invention relates generally to flip chip technology and more particularly, to a method and structure for reducing internal packaging stresses, improving adhesion properties, and reducing thermal resistance in flip chip packages by using more than one underfill material deposited in different regions of the flip chip interface. According to one embodiment, a method of forming a first underfill in an interior region of an interface such that a periphery region of the interface remains open, and forming a second underfill in the periphery region is disclosed.

4 Claims, 12 Drawing Sheets

(51) Int. Cl.
*H01L 23/498* (2006.01)
*H01L 25/065* (2006.01)
*H01L 23/00* (2006.01)

(52) U.S. Cl.
CPC ............... *H01L 2224/32225* (2013.01); *H01L 2224/73104* (2013.01); *H01L 2224/73204* (2013.01); *H01L 2224/81191* (2013.01); *H01L 2224/81203* (2013.01); *H01L 2224/81801* (2013.01); *H01L 2224/81815* (2013.01); *H01L 2224/83102* (2013.01); *H01L 2224/83191* (2013.01); *H01L 2224/83947* (2013.01); *H01L 2224/83951* (2013.01); *H01L 2224/83986* (2013.01); *H01L 2224/92125* (2013.01); *H01L 2225/06513* (2013.01); *H01L 2225/06517* (2013.01); *H01L 2924/1431* (2013.01); *H01L 2924/1434* (2013.01); *H01L 2924/152* (2013.01); *H01L 2924/15311* (2013.01); *H01L 2924/182* (2013.01); *H01L 2924/183* (2013.01); *H01L 2924/351* (2013.01)

(56) References Cited

U.S. PATENT DOCUMENTS

| | | | |
|---|---|---|---|
| 6,373,142 B1 * | 4/2002 | Hoang | H01L 21/563 257/783 |
| 6,800,946 B2 | 10/2004 | Chason et al. | |
| 6,815,817 B2 | 11/2004 | Akram et al. | |
| 7,141,448 B2 * | 11/2006 | Ramalingam | H01L 21/563 257/E21.503 |
| 7,148,560 B2 | 12/2006 | Lee et al. | |
| 7,190,082 B2 | 3/2007 | Nagarajan et al. | |
| 7,498,198 B2 * | 3/2009 | Charles | H01L 21/563 257/E21.54 |
| 7,776,651 B2 | 8/2010 | Hua | |
| 7,919,356 B2 * | 4/2011 | Farooq | H01L 21/563 438/108 |
| 8,357,565 B2 | 1/2013 | Ofner et al. | |
| 2002/0014688 A1 * | 2/2002 | Ramalingam | H01L 21/563 257/686 |
| 2005/0028361 A1 * | 2/2005 | Yin | H01L 21/563 29/841 |
| 2006/0046321 A1 * | 3/2006 | Peters | H01L 21/563 438/14 |
| 2008/0044951 A1 * | 2/2008 | Bang | H01L 21/563 438/121 |
| 2008/0265435 A1 * | 10/2008 | Charles | H01L 21/563 257/778 |
| 2009/0032974 A1 * | 2/2009 | Farooq | H01L 21/563 257/778 |
| 2011/0187005 A1 * | 8/2011 | Pagaila | H01L 25/00 257/777 |
| 2013/0115735 A1 | 5/2013 | Chen et al. | |
| 2015/0072479 A1 * | 3/2015 | Dias | H01L 21/56 438/127 |

OTHER PUBLICATIONS

Lin et al., "Study of the Thermo-mechanical Behavior of Glass Interposer for Flip Chip Packaging Applications", 2011 Electronic Components and Technology Conference. 2011 IEEE pp. 634-638.

* cited by examiner

LOW-STRESS DUAL UNDERFILL PACKAGING

BACKGROUND

The present invention relates generally to flip chip technology and more particularly, to a method and structure for reducing internal packaging stresses, improving adhesion properties, and reducing thermal resistance in flip chip packages by using more than one underfill material deposited in specific patterns.

The packaging industry has adopted the widespread use of flip chip technology for high performance applications. In a typical flip chip package, a semiconductor die may be bumped with individual conducting pads over its entire area. These conducting pads are connected to corresponding conducting pads on a substrate (or, in a three-dimensional package, another semiconductor die or interposer) using small solder balls, or bumps, such as controlled collapse chip connections (C4 connections). The conducting pads on the substrate may be connected to circuitry that routes the electrical signals to an array of conductors (ball grid arrays (BGA), column grid arrays (CGA) or land grid arrays (LGA)) to electrically connect to a printed circuit board.

Open spaces commonly remain between the C4 connections in the flip chip interface of the semiconductor die and the substrate. These open spaces may be filled with a non-conductive adhesive "underfill" material to protect the bumps and the flip chip interface from moisture, contaminants, and other environmental hazards. More importantly, this underfill material mechanically locks the flip chip surface to the substrate, thereby reducing the strains imposed on the small bumps due to the difference between the coefficient of thermal expansion (CTE) of the flip chip and the substrate. The underfill consequently prevents the bumps from being damaged (e.g., cracking, severing) during thermal expansion of the module.

SUMMARY

According to an embodiment, a method is disclosed. The method may include: joining two structures, a first structure and a second structure, together using a soldering process to form an interface, the interface having a plurality of solder connections; forming a first underfill material in an interior region of the interface, such that a periphery region of the interface extending from a perimeter of the second structure to the interior region remains free of the first underfill material, the first underfill material in direct contact with the first structure, the second structure, and at least one of the plurality of solder connections; and forming a second underfill in the periphery region of the interface, the second underfill material in direct contact with the first underfill, the first structure, the second structure, and at least one of the plurality of solder connections.

According to another embodiment, a structure is disclosed. The structure may include: an interface between an first structure and a second structure, the interface having an interior region and a periphery region, the periphery region extending from a perimeter of the second structure to the interior region; a plurality of solder connections in the interface; a plurality of gaps between the plurality of solder connections; a first underfill material occupying the plurality of gaps located in the interior region of the interface, the first underfill material in direct contact with the first structure, and the second structure, and at least one of the plurality of solder connections; and a second underfill material occupying the periphery region of the interface, the second underfill material in direct contact with the first underfill, the first structure, the second structure, and at least one of the plurality of solder connections.

According to another embodiment, a structure is disclosed. The structure may include: a first underfill in an interior region of a solder connection interface; and a second underfill in a periphery region of the solder connection interface, the periphery region extending from a perimeter of the flip-chip structure to the interior region.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
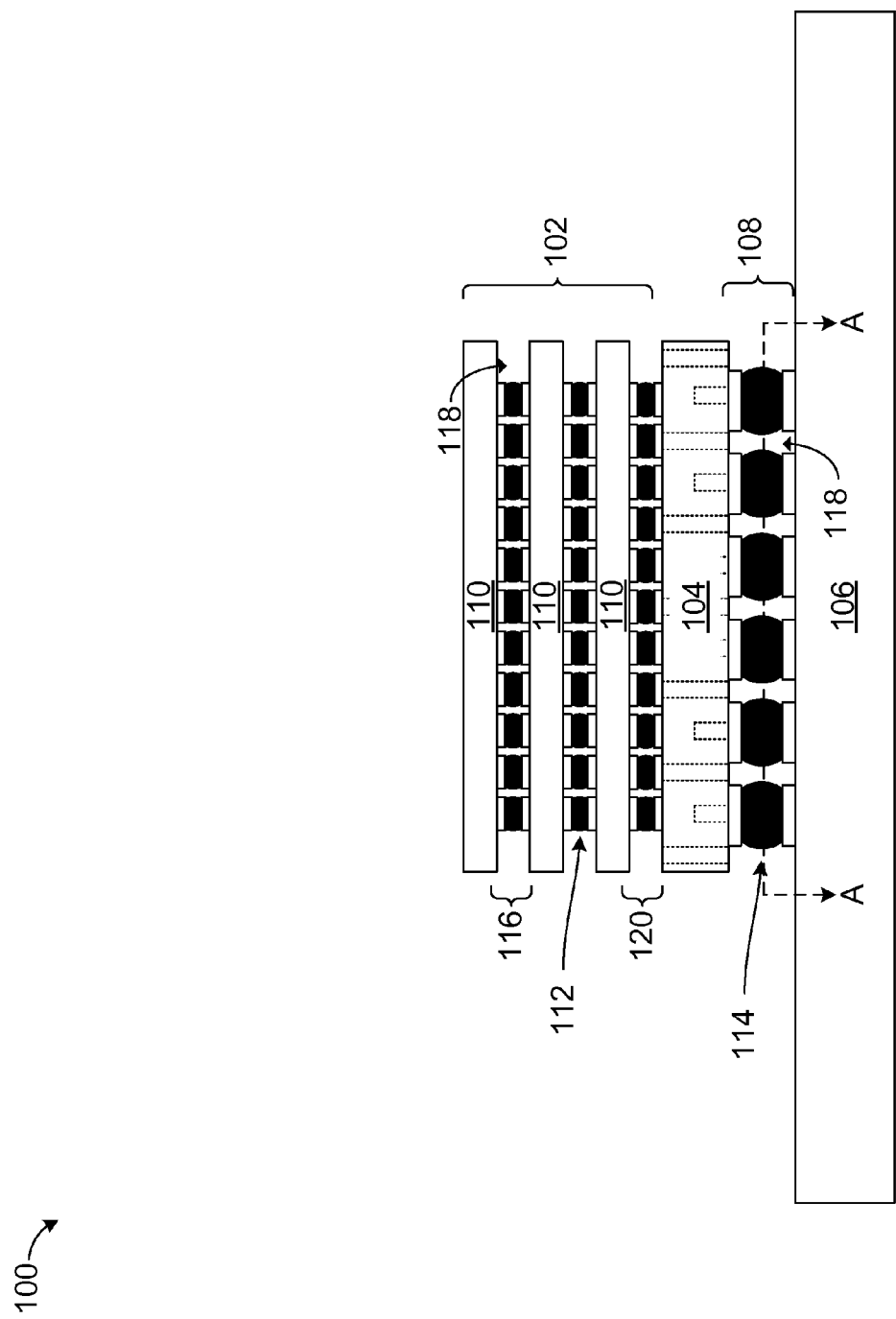
FIG. 1 is a cross-section view of 3D semiconductor stack, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to flip chip technology and more particularly, to a method and structure for reducing internal packaging stresses, improving adhesion properties, and reducing thermal resistance in flip chip packages by using more than one underfill material deposited in specific patterns. Generally, flip chip underfilling is achieved by needle dispensation along the edges of a flip chip. Capillary action draws the dispensed underfill material inwards, until the open spaces are substantially filled. Thermal curing of the underfill is usually performed to form a permanent bond. The thermal curing is commonly performed at high temperatures (approximately 150° C.), where both the semiconductor die and the substrate are relatively flat and stress free.

During the cooling of the package back down to room temperature, a difference in the coefficient of thermal expansion (CTE) between the semiconductor die and the substrate may result in different changes in dimension from thermal contraction. This may lead to package warpage, and to stress in various critical structures (e.g., C4 connections, laminate copper structures, etc.). In order to reduce this warpage, among other issues, underfill materials may be optimized with respect to a number of different properties, such as: fracture toughness, adhesion to various organic/inorganic surfaces, glass transition temperatures ($T_g$), CTE, Young's modulus, thermal conductivity, and viscosity, etc. Globally achieving an optimal point with respect to all these properties by engineering the underfill material is often difficult using a single underfill material.

One way to address the issues related to thermal conductivity requirements and mechanical stresses in flip chip packages is to use a first underfill optimized for thermal conductivity in an interior region of a flip chip interface and a second underfill optimized for mechanical stress in a periphery region of the flip chip interface. Embodiments by which to optimize the underfill used in a flip chip package with respect to the above properties are described below in detail with reference to FIGS. 1-12.

Referring now to FIG. 1, a cross-section view of 3D semiconductor stack 100 (hereinafter "3D stack"), is shown according to one embodiment. The 3D stack 100 may include a die stack 102, an interposer 104, and a substrate 106. Generally, the die stack 102 is coupled to the interposer 104, and the interposer 104 is coupled to the laminate substrate 106. Chip solder connections 112 (i.e., pads, flip chip connections) may be used to electrically join individual die 110 together at a second interface 116, and to join the die stack 102 to the interposer 104 at a third interface 120. Solder connections 114 may be used to mechanically join the interposer 104 to the substrate 106 at a first interface 108.

Generally, the chip solder connections 112 and the solder connections 114 may include an array of small spherical solder balls on the surface of the chip before the chip is joined to an adjoining structure, such as, for example, another chip, an interposer, or a substrate. More specifically, each individual chip solder connection 112 and solder connection 114 may include a bonding pad on the chip, a solder bump (i.e., ball), and a corresponding bonding pad on the adjoining structure. Corresponding structures may be joined by a soldering process. The soldering process may include aligning a spherical solder bump formed on one of the bonding pads on the first structure with a bonding pad on the second structure and heated (and in some embodiments, compressed) so that it melts and forms a solder connection between the bonding pads.

In an embodiment, the chip solder connections 112 may be generally smaller and disposed with a smaller pitch or higher density than the solder connections 114. For example, the pitch between two adjacent individual solder connections in the chip solder connections 112 may be approximately 50 μm, and the pitch between two adjacent individual solder connections in the solder connections 114 may be approximately 150 μm.

Examples of the die 110 may include a memory die, a logic die, or a processor die. The interposer 104 can simply include an electrical interface which may provide connectivity between the substrate 106 and the die stack 102. The interposer 104 can be used to spread one connection array to a wider pitch or reroute a particular connection to a different location. The interposer 104 can also include semiconductor devices, such as, for example, a passive device and a field effect transistor. In addition, the interposer 104 may be used to lessen or reduce the occurrence of failures caused by thermal expansion. The substrate 106 may include a ceramic substrate, a silicon substrate, a laminated composite, or an organic composite. Underfill material (not shown) may be deposited in the first interface 108 and the second interface 116 to fill a plurality of open spaces or gaps 118 (hereinafter "open spaces") and completely surround the individual solder connections 114 and/or chip solder connections 112.

Figure 2:
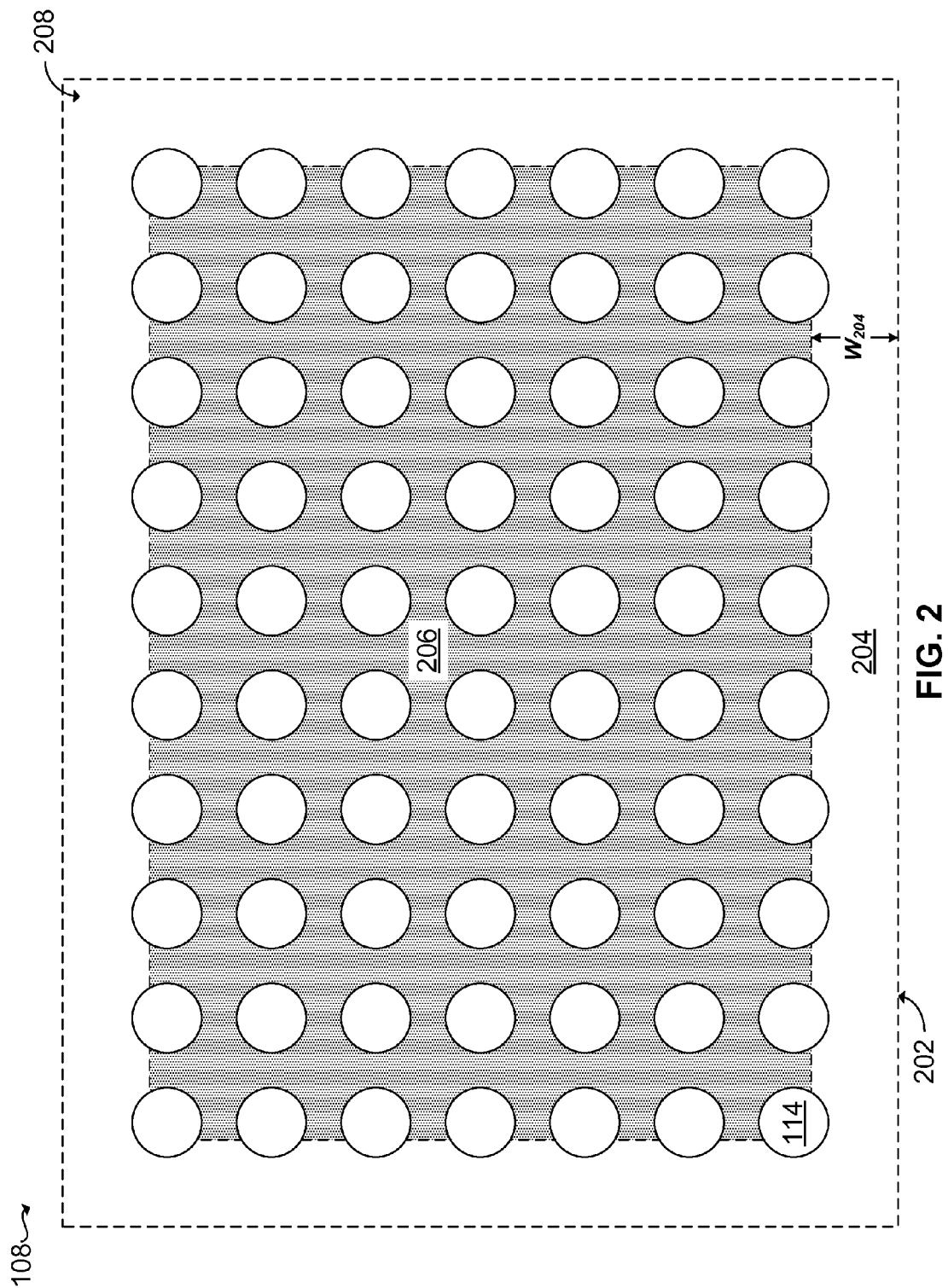
FIG. 2 is a cross-section view of FIG. 1 along section line A-A, according to an embodiment of the present invention.

Referring now to FIG. 2, a cross-section view of FIG. 1, along section line A-A is shown according to an embodiment. FIG. 2 illustrates the first interface 108 from a top view. The solder connections 114 may be formed within a perimeter 202 of the die stack 102 (FIG. 1). In an embodiment, the solder connections 114 may be formed in an interior region 206 of the first interface 108. The interior region 206 may be separated from the perimeter 202 by a periphery region 204 having a width $W_{204}$ ranging from approximately 1 mm to approximately 2 mm.

It should be noted that although the first interface 108 (FIG. 1) is shown, embodiments of the present invention are contemplated in which the dual underfill techniques described below in detail with reference to FIGS. 4-12 may be fabricated in the second interface 116 (FIG. 1) and/or the third interface 120 (FIG. 1).

The periphery region 204 may contain critical areas, such as corners 208 and the perimeter 202, which may undergo substantially more mechanical stress (e.g., tension, shear, and compression) than the interior region 206 during typical use. Typically, mechanical stress may be concentrated in these critical areas. For example, stress may be significantly lower outside the periphery region 204, at distances of approximately 1 mm away from the critical areas. However, thermal conductivity requirements during typical use may be higher in the interior region 206 than in these critical areas. Accordingly, it may be preferable to deposit a first underfill in the interior region 206 having optimal thermal properties and deposit a second underfill in the periphery region 204 having optimal mechanical properties. Embodiments by which to deposit the first underfill and the second underfill are described below in detail with reference to FIGS. 3-12.

An embodiment by which to form a dual underfill pattern in the first interface 108 is shown in FIGS. 3-7. In the present embodiment, a first underfill and a second underfill may both be formed through capillary action after the first interface 108 has been formed as described above with reference to FIG. 1. In this embodiment, the first underfill and the second underfill may be deposited in openings around the perimeter 202 and may migrate into the open spaces 118 through capillary action.

Figure 3:
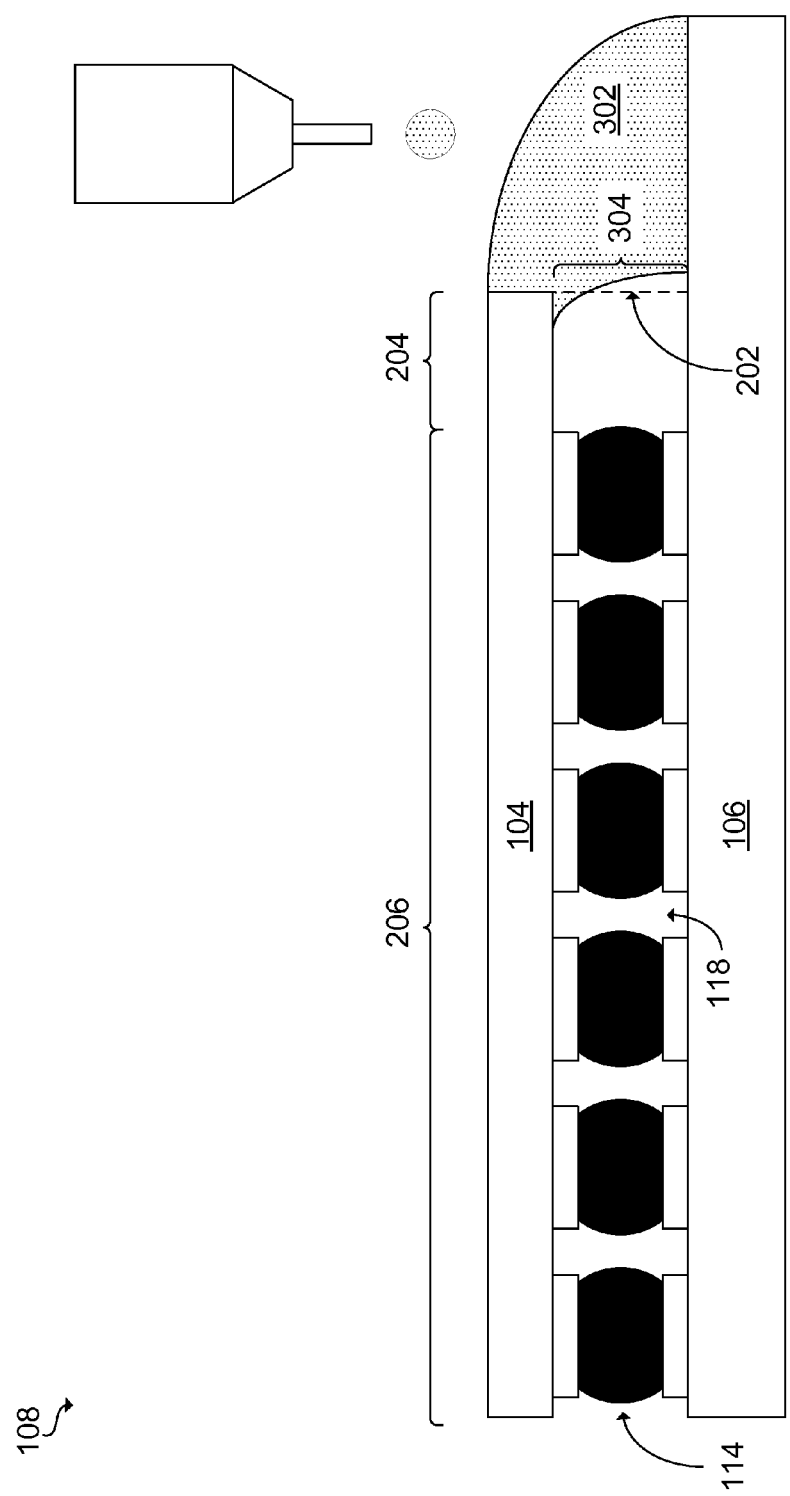
FIG. 3 is a cross-section view of a first interface illustrating depositing a first underfill, according to an embodiment of the present invention.

Referring now to FIG. 3, a cross-section view of the first interface 108 is shown. FIG. 3 illustrates depositing the first underfill 302 in an opening 304 of the 3D stack 100 (FIG. 1). In an embodiment, the first underfill 302 may be dispensed onto the substrate 106 adjacent to the perimeter 202 of the die stack 102 (FIG. 1). Preferably, a small volume of the first underfill 302 material may be used so as to minimize the formation of a fillet (i.e., a tapered section of underfill that extends out from around the perimeter 202 and onto a side of the interposer 104).

Figure 4:
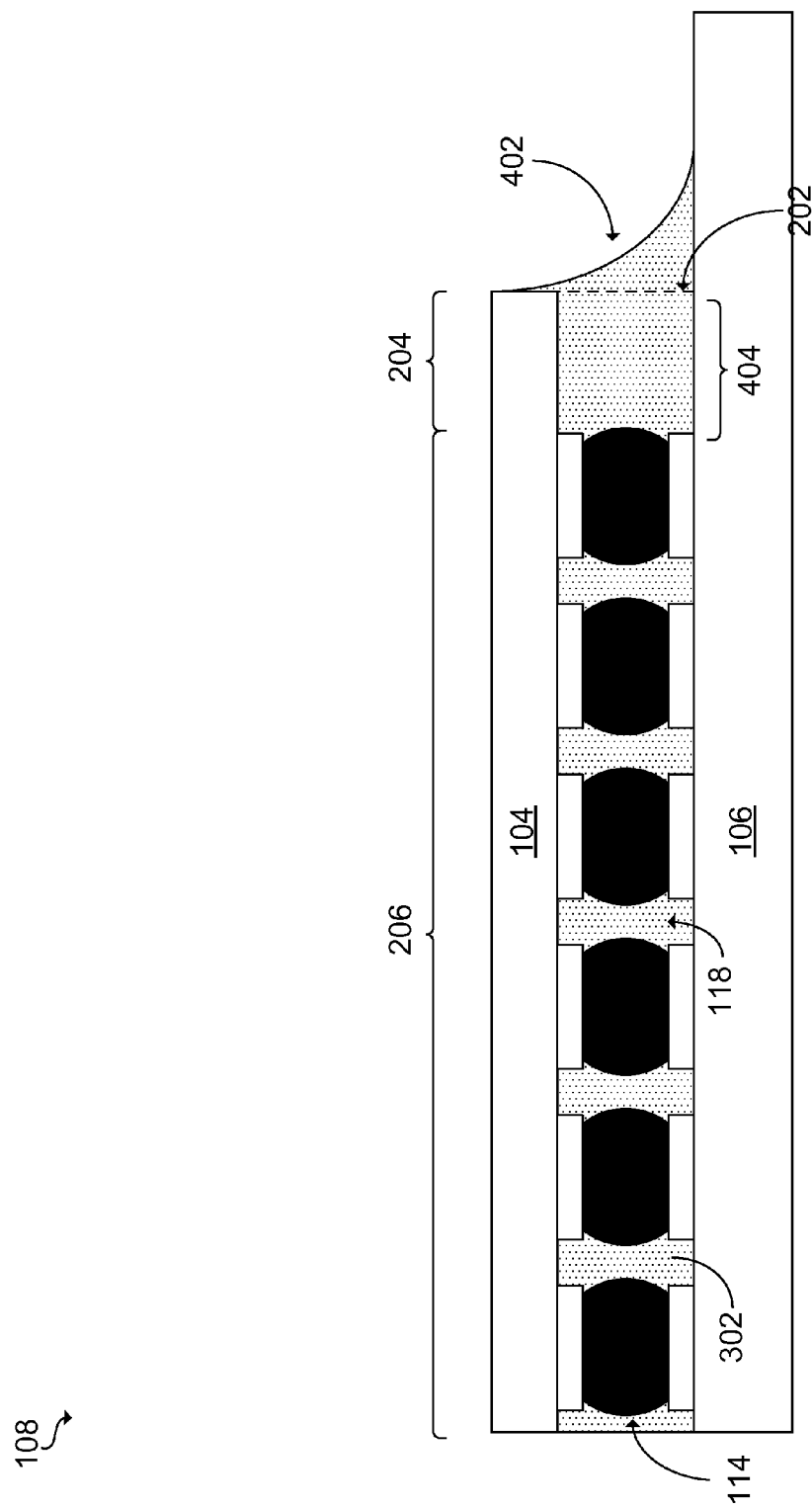
FIG. 4 is a cross-section view of the first interface illustrating a migration of the first underfill, according to an embodiment of the present invention.

Referring now to FIG. 4, a cross-section view of the first interface 108 is shown. FIG. 4 illustrates the first interface 108 after the first underfill 302 has migrated from the opening 304 into the open spaces 118 through capillary action. In an embodiment, the first underfill 302 may migrate into the interior region 206 as well as the periphery region 204 and may occupy the open spaces 118 surrounding the solder connections 114. The first underfill 302 may have a periphery portion 404 that occupies the periphery region 204. In an embodiment, an excess amount of the first underfill 302 may form a fillet 402 extending from the substrate 106 to a side of the interposer 104.

Figure 5:
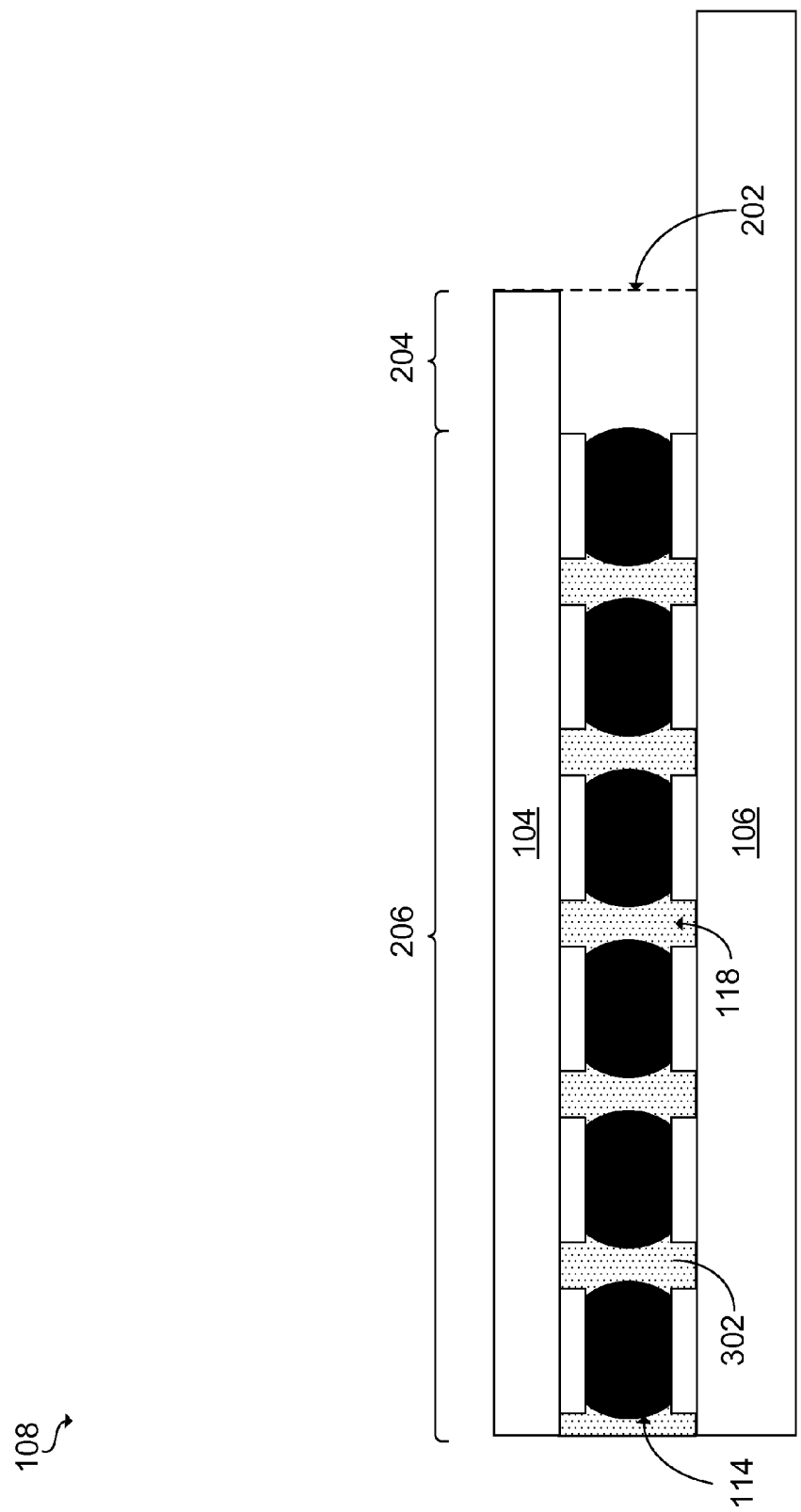
FIG. 5 is a cross-section view of the first interface illustrating removing a portion of the first underfill from a periphery region of the first interface, according to an embodiment of the present invention.

Referring now to FIG. 5, a cross-section view of the first interface 108 is shown. FIG. 5 illustrates removing both the periphery portion 404 (FIG. 4) and the fillet 402 (FIG. 4) of the first underfill 302. In an embodiment, the periphery portion 404 (FIG. 4) and the fillet 402 (FIG. 4) may be removed using a wiping process. In an embodiment, the wiping process may include mechanically clearing away the periphery portion 404 (FIG. 4) and the fillet 402 (FIG. 4) soon after the first underfill 302 is deposited to expose the periphery region 204. In another embodiment, the periphery portion 404 (FIG. 4) and the fillet 402 (FIG. 4) may be removed by exposing the first underfill 302 to a solvent for a controlled period of time. After the periphery portion 404 (FIG. 4) and the fillet 402 (FIG. 4) are removed, the first underfill 302 may be cured. In an embodiment, a thermal curing process may be used. The thermal curing process may include heating the 3D stack 100 (FIG. 1) to approximately 150° C. to approximately 165° C. for approximately 90 min to approximately 120 min.

Figure 6:
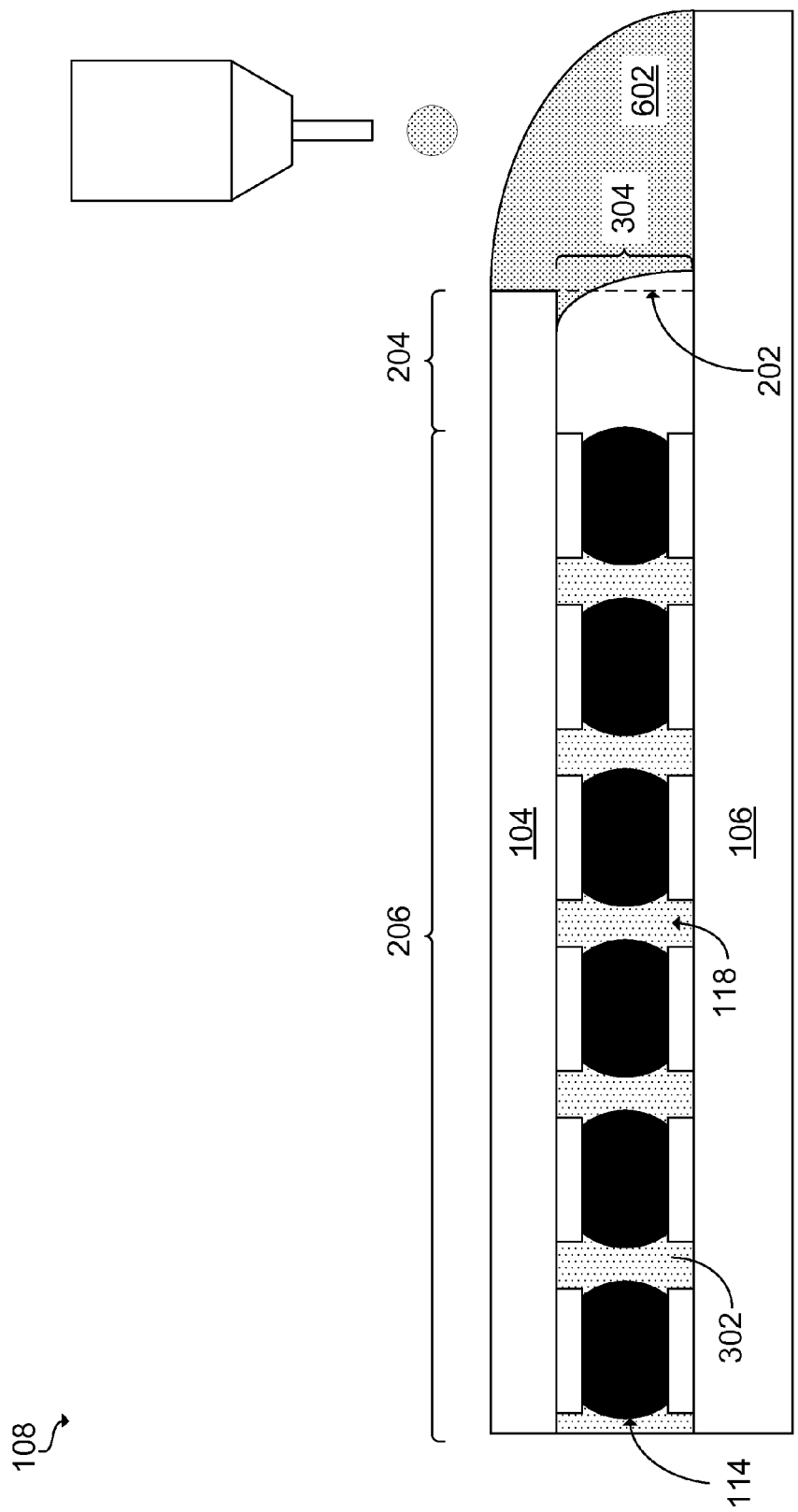
FIG. 6 is a cross-section view of the first interface illustrating depositing a second underfill, according to an embodiment of the present invention.

Referring now to FIG. 6, a cross-section view of the first interface 108 is shown. FIG. 6 illustrates depositing the second underfill 602 in the opening 304. In an embodiment, the second underfill 602 may be dispensed onto the substrate 106 adjacent to the perimeter 202 of the die stack 102 (FIG. 1). In an embodiment, a sufficient amount of the second underfill 602 may be deposited so that a fillet may be formed.

Figure 7:
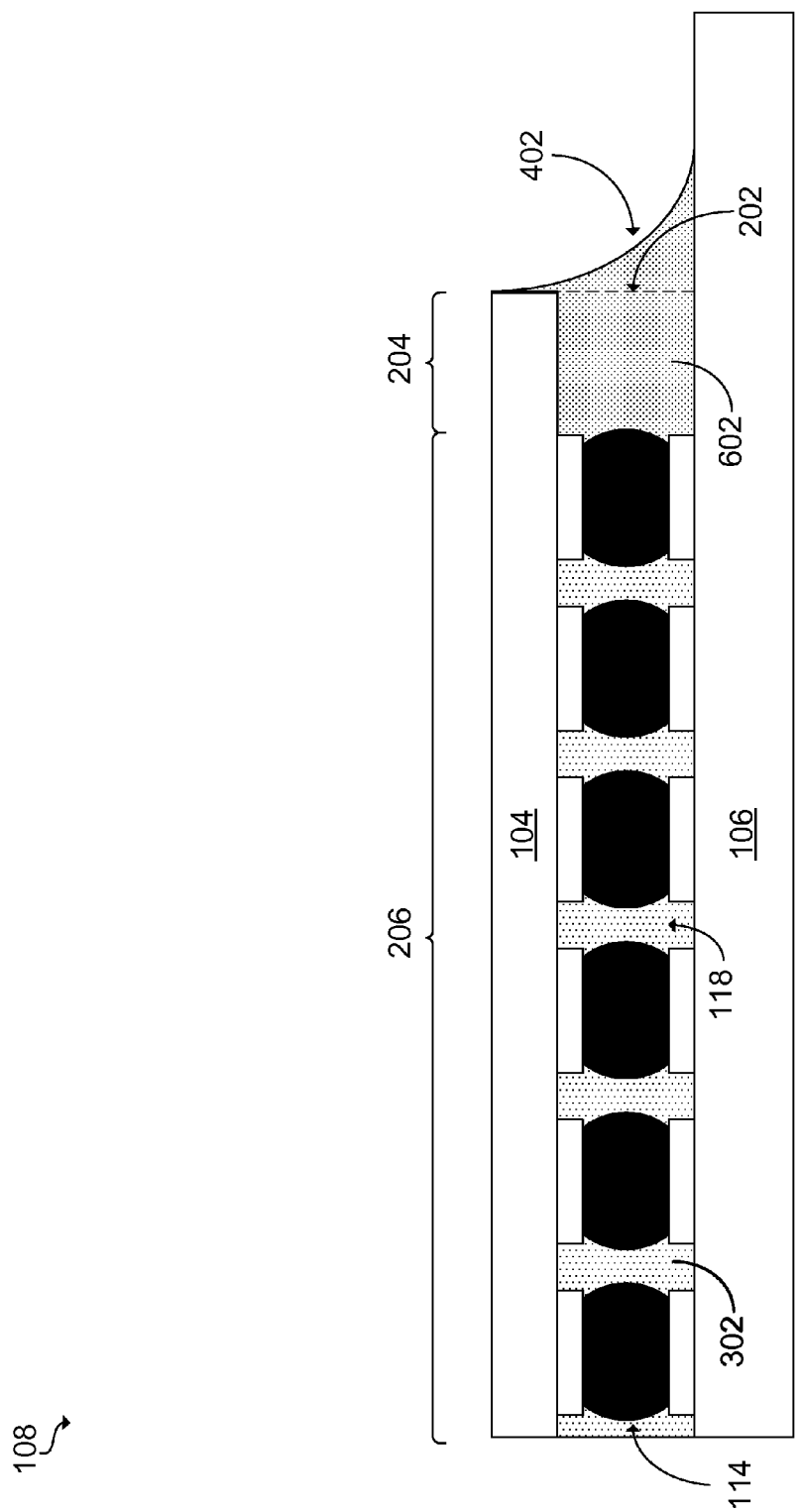
FIG. 7 is a cross-section view of the first interface illustrating a migration of the second underfill, according to an embodiment of the present invention.

Referring now to FIG. 7, a cross-section view of the first interface 108 is shown. FIG. 7 illustrates the first interface 108 after the second underfill 602 has migrated from the opening 304 into the open spaces 118 through capillary action. In addition, the second underfill 602 may form a fillet 702 extending beyond the perimeter 202 and from the substrate 106 to a side of the interposer 104. After the second underfill 602 has migrated into the periphery region 204 and the fillet 702 has formed, the second underfill 602 may be cured. In an embodiment, a thermal curing process may be used. The thermal curing process may include heating the 3D stack 100 (FIG. 1) to approximately 150° C. to approximately 165° C. for approximately 90 min to approximately 120 min.

Another embodiment by which to form a dual underfill in the first interface is shown in FIGS. 8-12. In the present embodiment, the first underfill 302 may be formed on a single structure, either the substrate 106 or the interposer 104, before the first interface 108 is formed using the bonding process described above with reference to FIG. 1.

Figure 8:
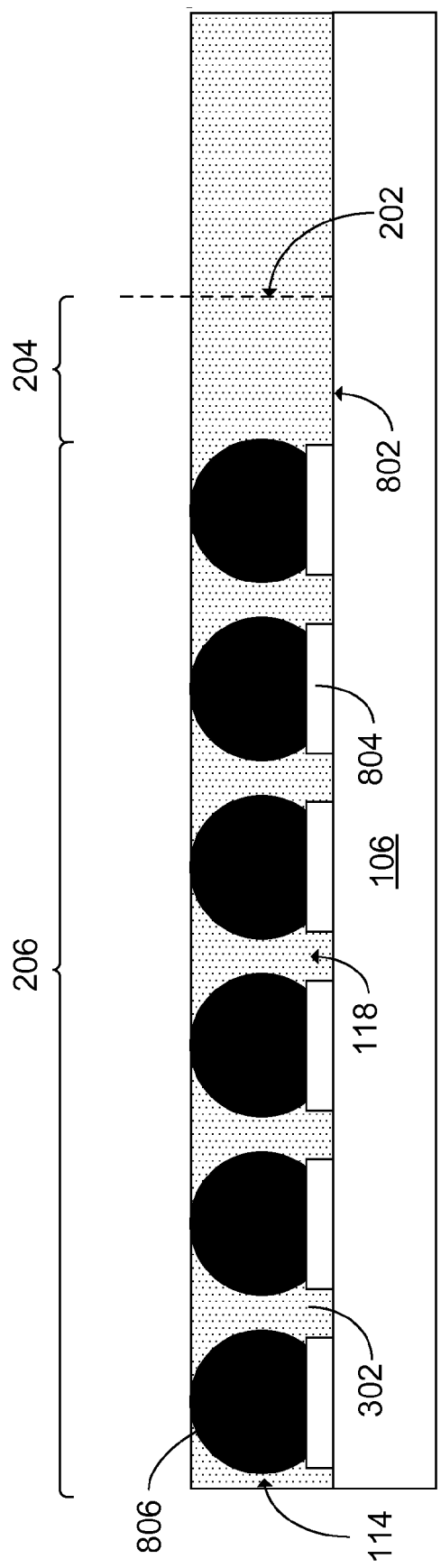
FIG. 8 is a cross-section view of a substrate and a plurality of solder bumps illustrating forming the first underfill on the substrate, according to an embodiment of the present invention.

Referring now to FIG. 8, a cross-section view of the substrate 106 and a portion of the solder connections 114 is shown. FIG. 8 illustrates forming the first underfill 302 on the substrate 106 before the first interface 108 is formed. In an embodiment, the first underfill 302 may be a photodefinable liquid. The first underfill 302 may be applied to the entire upper surface 802 using a spin coating process. The first underfill 302 may have a height that is less than or substantially similar to a combined height of a bonding pad 804 and a solder ball 806, which may be part of the solder connection 114.

Figure 9:
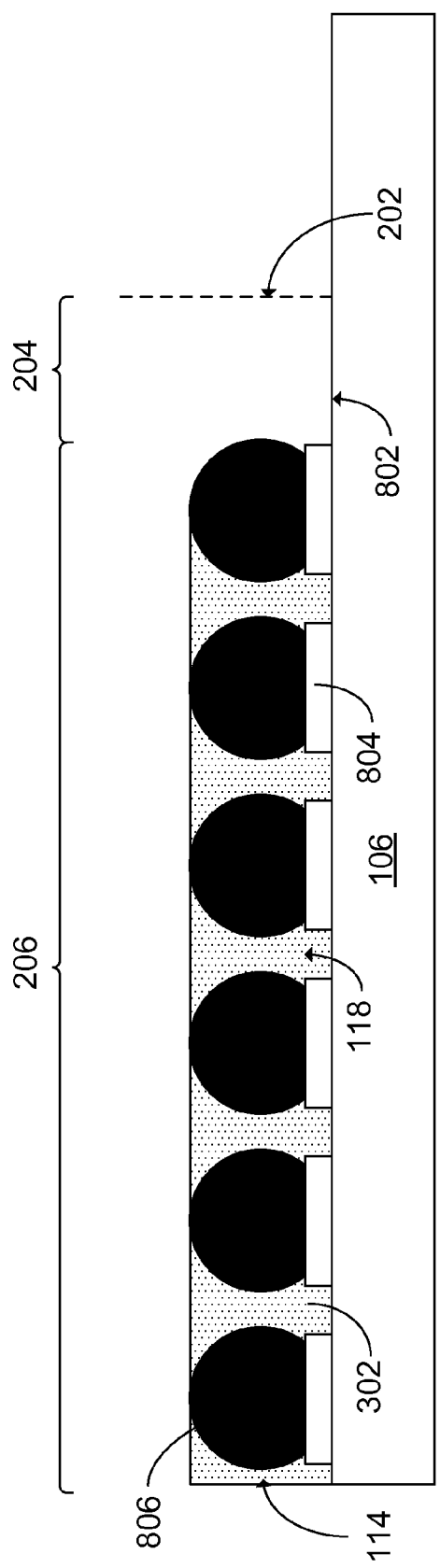
FIG. 9 is a cross-section view of the substrate and the plurality of solder bumps illustrating removing a portion of the first underfill from the substrate, according to an embodiment of the present invention.

Referring now to FIG. 9, a cross-section view of the substrate 106 and a portion the solder connections 114 is shown. FIG. 9 illustrates removing a portion of the first underfill 302 from the periphery region 204. In an embodiment, a portion of the first underfill 302 located in the interior region 206 may be exposed to light to pre-cure it. Another portion of the first underfill 302 located in the periphery region 204 may be protected from exposure to light so it remains un-cured. This un-cured portion of the first underfill 302 in the periphery region 204 may then be removed using a washing process, such as, for example, mechanical washing or solvent washing.

In another embodiment, the first underfill 302 may be deposited only on a portion of the upper surface 802 that corresponds to the interior region 206 using selective techniques. In an embodiment, the first underfill 302 may be a liquid with a relatively high viscosity. The first underfill 302 may be deposited by positioning a stencil (not shown) over the substrate 106. The stencil may have areas that have been cut away to clear the solder balls 806 and also to expose the interior region 206. The periphery region 204 may be covered by the stencil to prevent deposition of the first underfill 302. The first underfill 302 may then be deposited over the stencil, thereby only covering the interior region 206. The first underfill 302 may have a height that is less than or substantially similar to a combined height of the first bonding pad 804 and the solder ball 806, which may be part of the solder connection 114. In an embodiment, the first underfill 302 may be partially cured by, for example, a thermal curing process, after it is deposited. The stencil may then be removed.

In another embodiment, the first underfill 302 may be a liquid with a relatively low viscosity. The first underfill 302 may be deposited using a jet printer (not shown). The jet printer may be used to selectively deposit the first underfill 302 only on the interior region 206, leaving the periphery region 204 uncovered. The first underfill 302 may have a height that is less than or substantially similar to a combined height of the first bonding pad 804 and the solder ball 806, which may be part of the solder connection 114. The first underfill may be partially cured by, for example, a thermal curing process after it is deposited.

In another embodiment, the first underfill 302 may be a film. The first underfill 302 may be deposited by positioning a stencil (not shown) over the substrate 106. The stencil may have areas that have been cut away to clear the solder balls 806 and also to expose the interior region 206. The first underfill 302 film may be placed on the stencil and the exposed regions of the substrate 106. A load plate (not shown) with raised areas matching the openings of the stencil may be applied to the top of the stencil. The first underfill 302 film may then be cut and laminated so as to only adhere to the interior region 206. The first underfill 302 film may be deposited so an upper surface of the solder balls 806 remain exposed. The stencil may then be removed.

Figure 10:
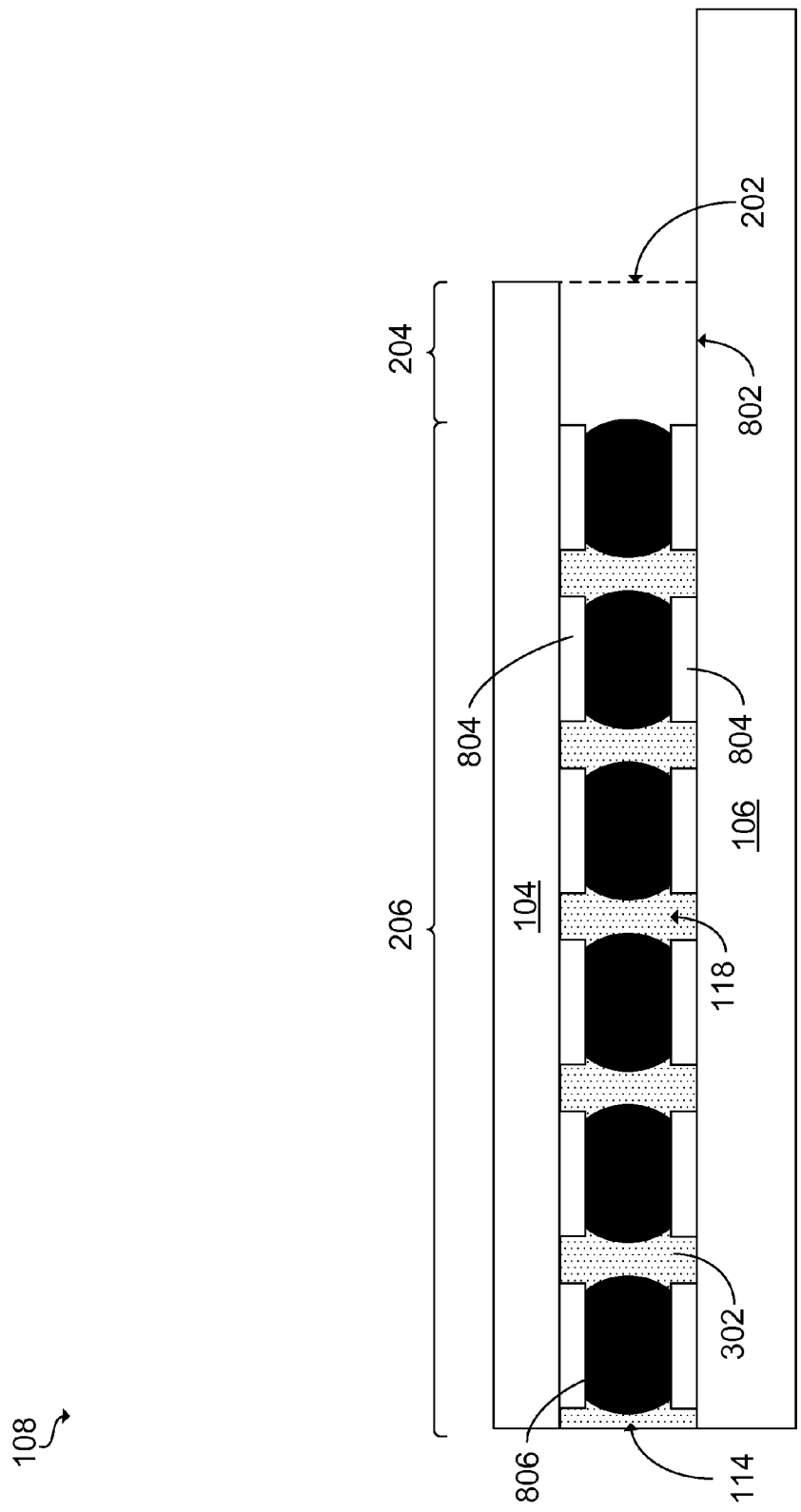
FIG. 10 is a cross-section view of the substrate, the plurality of solder bumps, and an interposer illustrating forming the first interface, according to an embodiment of the present invention.

After the first underfill 302 is formed on the upper surface 802 of the substrate 106 so that only a portion corresponding to the interior region 206 is covered, the first interface 108 (FIG. 10) may be formed between the substrate 106 and the interposer 104 (FIG. 10).

Referring now to FIG. 10, a cross-section view of the substrate 106, the solder connections 114, the first underfill 302, and the interposer 104 is shown. FIG. 10 illustrates forming the first interface 108 using the soldering process described above with reference to FIG. 1. In an embodiment, the interposer 104, having corresponding bonding pads 804, may be placed on the solder balls 806 so that the bonding pads 804 are aligned with the solder balls 806. The substrate 106 and the interposer 104 may then be heated so that the solder balls 806 partially melt and form a solder connection between the corresponding bonding pads 804, thereby forming the first interface 108.

Figure 11:
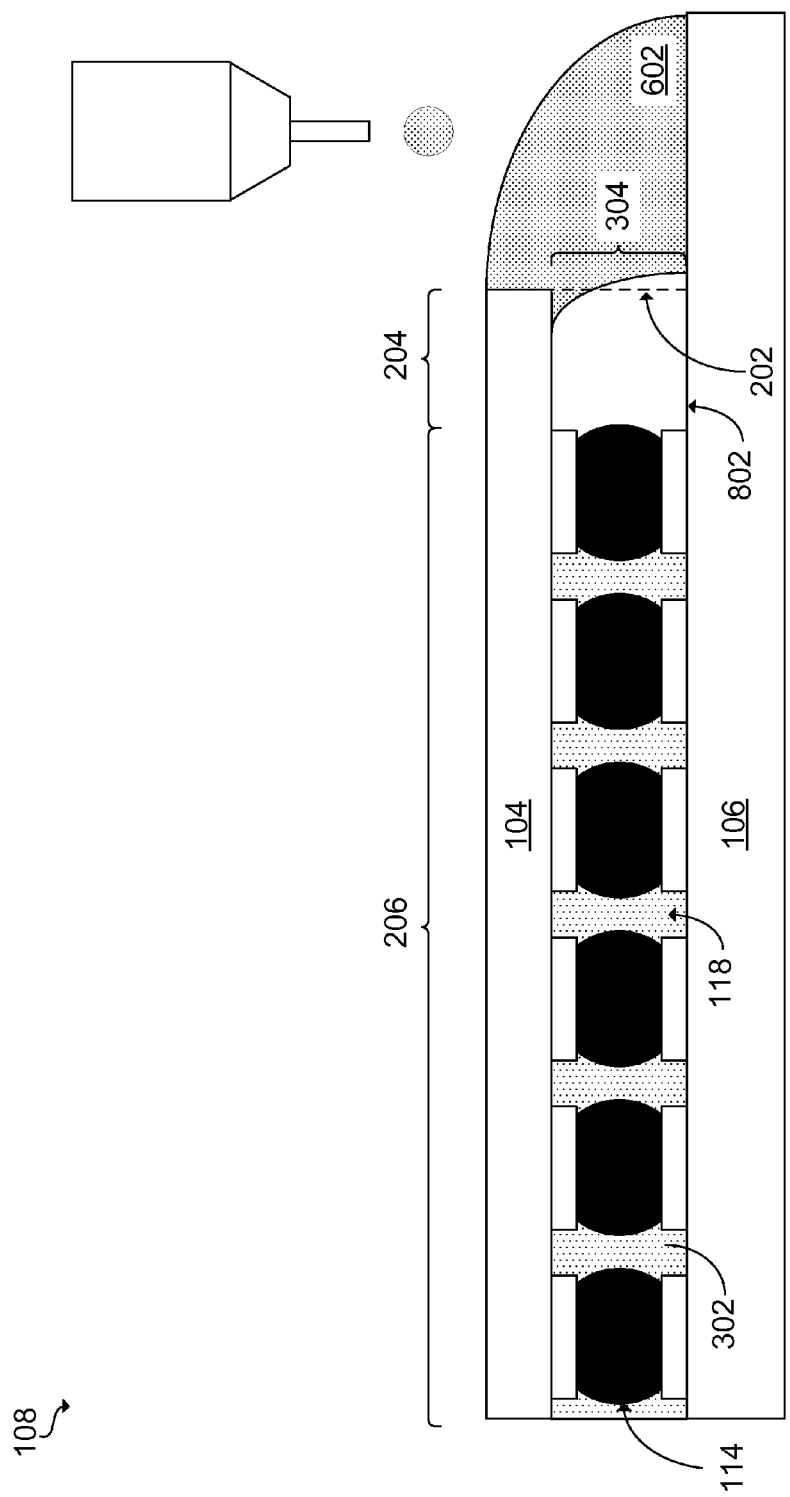
FIG. 11 is a cross-section view of the first interface illustrating depositing the second underfill, according to an embodiment of the present invention.

Referring now to FIG. 11, a cross-section view of the first interface 108 is shown. FIG. 11 illustrates depositing the second underfill 602 in the opening 304. In an embodiment, the first underfill 302 may be dispensed onto the substrate 106 adjacent to the perimeter 202 of the die stack 102 (FIG. 1). In an embodiment, a sufficient amount of the second underfill 602 may be deposited so that a fillet may be formed.

Figure 12:
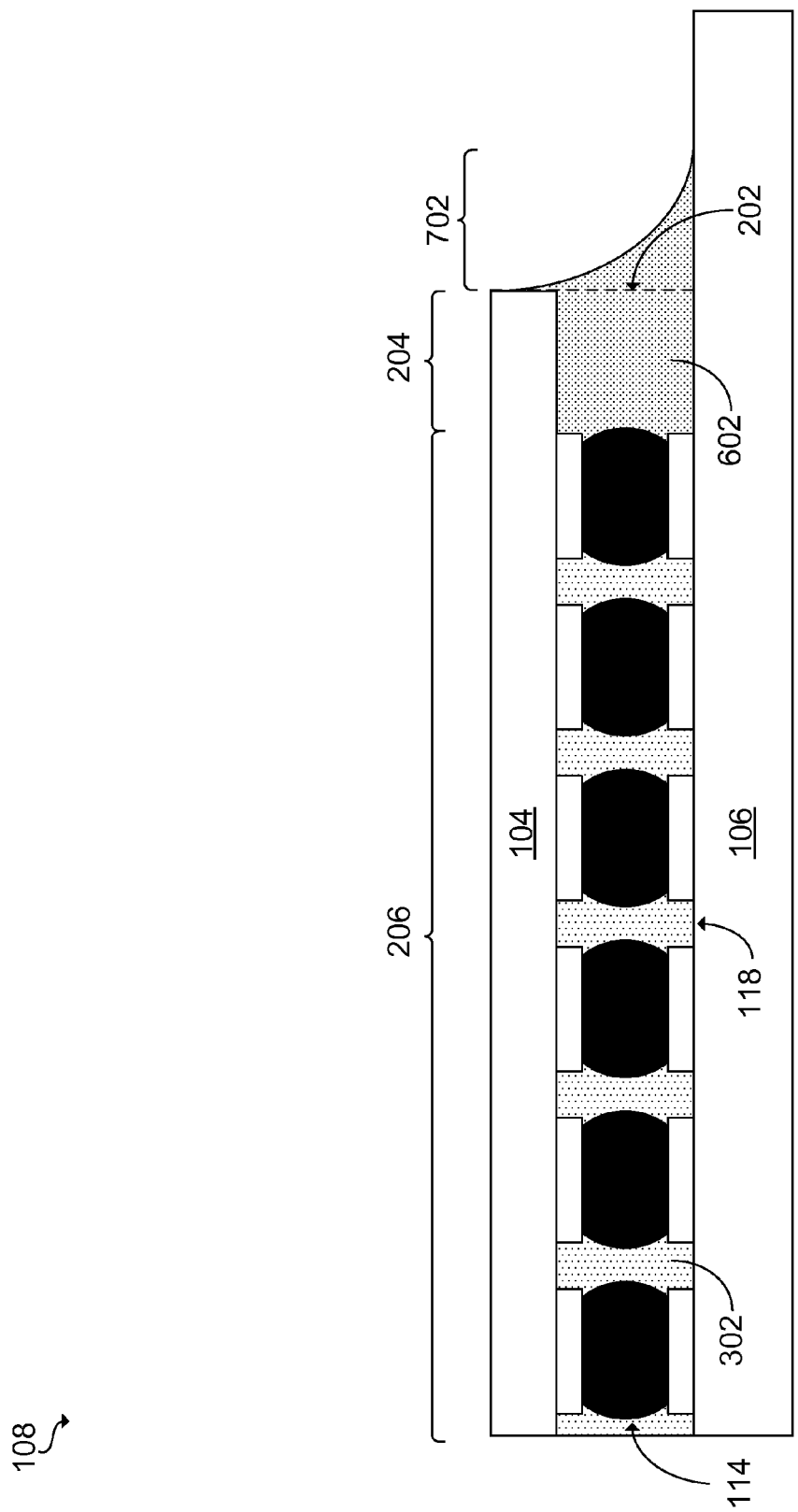
FIG. 12 is a cross-section view of the first interface illustrating a migration of the second underfill, according to an embodiment of the present invention.

Referring now to FIG. 12, a cross-section view of the first interface 108 is shown. FIG. illustrates the first interface 108 after the second underfill 602 has migrated from the opening 304 into the open spaces 118 through capillary action. In addition, the second underfill 602 may form a fillet 702 extending beyond the perimeter 202 and from the substrate 106 to a side of the interposer 104. After the second underfill 602 has migrated into the periphery region 204 and the fillet 702 has formed, the second underfill 602 may be cured. In an embodiment, a thermal curing process may be used. The thermal curing process may include heating the 3D stack 100 (FIG. 1) to approximately 150° C. to approximately 165° C. for approximately 90 min to approximately 120 min.

Embodiments of the present invention may allow for the use of more than one underfill in different regions of a flip chip interface, each underfill having different properties and chosen for a particular purpose. As described above, the periphery region 204 may contain critical areas that may experience substantially more mechanical stress (e.g., tension, shear, and compression) than the interior region 206 during typical use. In addition, the interior region 206 may experience substantially larger rate of heat generation than the periphery region 204 during use of the flip chip package. Instead of using a single underfill, embodiments of the present invention may allow for the use of more than one underfill material that may be tailored to address concerns of stress and temperature in both the interior region 206 and the periphery region 204. More specifically, the first underfill 302 may have a low thermal resistance and may be selectively applied in the interior region 206 of the first interface 118. The second underfill 602 may be resistant to mechanical stress and maybe selectively applied in the periphery region 204 of the first interface 118.

The terminology used herein is for the purpose of describing particular embodiments only and is not intended to be limiting of the invention. As used herein, the singular forms "a," "an," and "the" are intended to include the plural forms as well, unless the context clearly indicates otherwise. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    joining two structures, a first structure and a second structure, together using a soldering process to form an interface, the interface having a plurality of solder connections;
    forming a first underfill material in an interior region of the interface, such that a periphery region of the interface extending from a perimeter of the second structure to the interior region remains free of the first underfill material, the first underfill material in direct contact with the first structure, the second structure, and at least one of the plurality of solder connections;
    exposing the first underfill material in the interior region to light while protecting the first underfill material in the periphery region from light, thereby curing the first underfill material in the interior region while leaving the first underfill material in the periphery region in an uncured state;
    removing the first underfill material in the periphery region; and
    forming a second underfill in the periphery region of the interface, the second underfill material in direct contact with the first underfill, the first structure, the second structure, and at least one of the plurality of solder connections.

2. The method of claim 1, wherein the periphery region has a width ranging from approximately 1 mm to approximately 2 mm.

3. The method of claim 1, wherein the forming the second underfill material in the periphery region of the interface comprises:
   depositing the second underfill on the first structure outside the perimeter of the second structure after the joining the two structures, such that the second underfill material migrates into the periphery region of the interface through capillary action.

4. The method of claim 1, wherein the forming the second underfill material in the periphery region of the interface comprises:
   depositing the second underfill on the first structure outside the perimeter of the second structure after the joining the two structures, such that the second underfill material migrates into the periphery region of the interface through capillary action and extends beyond the perimeter of the second structure to form a fillet, the fillet extending from the first structure to a side of the second structure above the interface.

\* \* \* \* \*